(12) United States Patent
Murata et al.

(10) Patent No.: US 11,309,276 B2
(45) Date of Patent: Apr. 19, 2022

(54) SEMICONDUCTOR MODULE

(71) Applicant: FUJI ELECTRIC CO., LTD., Kawasaki (JP)

(72) Inventors: Yuma Murata, Kawasaki (JP); Ryoichi Kato, Kawasaki (JP); Naoyuki Kanai, Kawasaki (JP); Akito Nakagome, Kawasaki (JP); Yoshinari Ikeda, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/185,931

(22) Filed: Feb. 25, 2021

(65) Prior Publication Data

US 2021/0280555 A1 Sep. 9, 2021

(30) Foreign Application Priority Data

Mar. 6, 2020 (JP) .............................. JP2020-038366

(51) Int. Cl.
*H01L 23/00* (2006.01)
*H01L 23/538* (2006.01)
*H01L 25/07* (2006.01)

(52) U.S. Cl.
CPC .......... *H01L 24/48* (2013.01); *H01L 23/5386* (2013.01); *H01L 24/05* (2013.01); *H01L 24/40* (2013.01); *H01L 25/072* (2013.01); *H01L 2224/05553* (2013.01); *H01L 2224/48091* (2013.01); *H01L 2224/48111* (2013.01); *H01L 2224/48137* (2013.01)

(58) Field of Classification Search
CPC ..... H01L 24/48; H01L 23/5386; H01L 24/05; H01L 24/40; H01L 25/072; H01L 2224/05553; H01L 2224/48091; H01L 2224/48111; H01L 2224/48137; H01L 23/49811; H01L 25/18

See application file for complete search history.

(56) References Cited

U.S. PATENT DOCUMENTS 6,445,068 B1 9/2002 Sofue et al.
8,637,964 B2 1/2014 Jones et al.
(Continued)

FOREIGN PATENT DOCUMENTS

JP 2000294726 A 10/2000
JP 2006066712 A 3/2006
(Continued)

*Primary Examiner* — Elias Ullah
(74) *Attorney, Agent, or Firm* — Rabin & Berdo, P.C.

(57) ABSTRACT

A semiconductor module includes a case with a side wall in a first direction in which gate and source terminals are embodied and exposed therefrom, first and second semiconductor elements each having gate and source electrodes, gate and source relay layers positioned at a center between the first and second semiconductor elements in the first direction at a side of the semiconductor elements farther from the side wall, first gate and source wires respectively connecting the gate and source terminals to the gate and source relay layers, second gate and source wires, and third gate and source wires, respectively connecting the gate and source electrodes of the first semiconductor element, and the gate and source electrode of the second semiconductor element, to the gate and source relay layers. The first to third source wires are respectively located closer to the first to third gate wires than any other gate wires.

6 Claims, 6 Drawing Sheets

(56) References Cited

U.S. PATENT DOCUMENTS

| | | | |
|---|---|---|---|
| 2017/0338162 A1 | 11/2017 | Cottet et al. | |
| 2018/0240732 A1 | 8/2018 | Tonedachi | |
| 2020/0258853 A1 | 8/2020 | Namba et al. | |

FOREIGN PATENT DOCUMENTS

| | | | |
|---|---|---|---|
| JP | 2006086438 A | 3/2006 | |
| JP | 2007306748 A | 11/2007 | |
| JP | 2010010505 A | 1/2010 | |
| JP | 2013131590 A | 7/2013 | |
| JP | 2017208547 A | 11/2017 | |
| JP | 2018137283 A | 8/2018 | |
| WO | 2019064874 A1 | 4/2019 | |

SEMICONDUCTOR MODULE

CROSS REFERENCE TO RELATED APPLICATIONS

This application is based upon and claims the benefit of priority of the prior Japanese Patent Application No. 2020-038366, filed on Mar. 6, 2020, the entire contents of which are incorporated herein by reference.

BACKGROUND OF THE INVENTION

Field of the Invention

The present invention relates to a semiconductor module.

Description of the Related Art

A semiconductor device has a substrate having thereon semiconductor elements such as an insulated gate bipolar transistor (IGBT), a power metal oxide semiconductor field effect transistor (MOSFET), or freewheeling diode (FWD) and is used in an inverter apparatus or the like (see Japanese Patent Laid-Open No. 2013-131590, Japanese Patent Laid-Open No. 2006-066712, International Publication No. WO 2019/064874, Japanese Patent Laid-Open No. 2018-137283, Japanese Patent Laid-Open No. 2007-306748, Japanese Patent Laid-Open No. 2000-294726, Japanese Patent Laid-Open No. 2006-086438, Japanese Patent Laid-Open No. 2010-010505, Japanese Patent Laid-Open No. 2017-208547, and U.S. Pat. No. 8,637,964, for example).

Japanese Patent Laid-Open No. 2013-131590 discloses a terminal holding block disposed between a plurality of semiconductor chips that are connected in parallel. Japanese Patent Laid-Open No. 2006-066712 discloses a circuit device with a full-bridge circuit implemented therein, wherein transistors are disposed at four corners, conductive paths are provided at the center, and wiring is provided from the transistors to the conductive paths. International Publication No. WO 2019/064874 discloses disposing a control signal substrate which has a gate wire and an emitter wire between a plurality of power semiconductor elements. Japanese Patent Laid-Open No. 2018-137283 discloses a gate electrode layer and a bonding wire connected thereto in a semiconductor device. Japanese Patent Laid-Open No. 2006-086438 and Japanese Patent Laid-Open No. 2010-010505 disclose disposing a positive electrode terminal and a negative electrode terminal on parallel flat plates to mutually cancel magnetic fields thereof and with the interval between the positive electrode terminal and the negative electrode terminal being reduced in order to reduce wiring inductance. U.S. Pat. No. 8,637,964, Description, discloses adopting a mirror image structure which has a looping path of current flowing through a positive electrode and a negative electrode within a circuit to attempt reduction of inductance and suppression of fluctuations of inductance between a plurality of chips.

In recent years, increases of the speed of switching have been demanded to reduce a switching loss that occurs upon operation in a power semiconductor module used for power control applications. In a power semiconductor module, when a semiconductor element is turned off, surge voltage ($\Delta V = L \times di/dt$) is applied to direct-current voltage of a power supply because of the time rate of change of current and wiring inductance. When surge voltage exceeding the resistance to pressure of the semiconductor element is applied, there is a possibility that the semiconductor element is deteriorated or is destroyed. Therefore, the wiring inductance is required to be as small as possible for driving the power semiconductor module with high-speed switching.

While technologies that attempt reduction of inductance and suppression of fluctuations of the inductance in a main circuit are disclosed in the literatures above, fluctuations of the inductance of the gate-source wiring between chips is also required to be suppressed as much as possible in order to realize a further increase of the speed of switching. Therefore, for the further increase of the speed of switching, a structure that also suppresses fluctuations of inductance of the gate-source wiring is demanded, in addition to the reduction of the inductance on the main circuit side and suppression of fluctuations of the inductance between chips.

The present invention has been made in view of such points, and it is one of objects of the present invention to provide a semiconductor module that can reduce fluctuations of gate-source inductance.

SUMMARY OF THE INVENTION

A semiconductor module according to one aspect of the present invention includes a gate terminal and a source terminal each having a flat part exposed on a side wall part of a case member having a rectangular frame shape in planar view, a first semiconductor element and a second semiconductor element each disposed in parallel with the side wall part of the case member, each having a gate electrode and a source electrode on an upper surface of the semiconductor element, and being electrically connected in parallel, a gate relay layer and a source relay layer each being installed at a middle position between the first semiconductor element and the second semiconductor element and extending in parallel with the side wall part of the case member, a first gate wire extending between the first semiconductor element and the second semiconductor element and being connected from the flat part of the gate terminal to the gate relay layer, a first source wire extending between the first semiconductor element and the second semiconductor element and being connected from the flat part of the source terminal to the source relay layer, a second gate wire being connected from the gate electrode of the first semiconductor element to the gate relay layer, a second source wire being connected from the source electrode of the first semiconductor element to the source relay layer, a third gate wire being connected from the gate electrode of the second semiconductor element to the gate relay layer, and a third source wire being connected from the source electrode of the second semiconductor element to the source relay layer. The first source wire is adjacent to the first gate wire, the second source wire is adjacent to the second gate wire, and the third source wire is adjacent to the third gate wire.

Advantageous Effects of Invention

According to the present invention, fluctuations of gate-source inductance can be reduced.

DETAILED DESCRIPTION OF THE PREFERRED EMBODIMENTS

Figure 1:
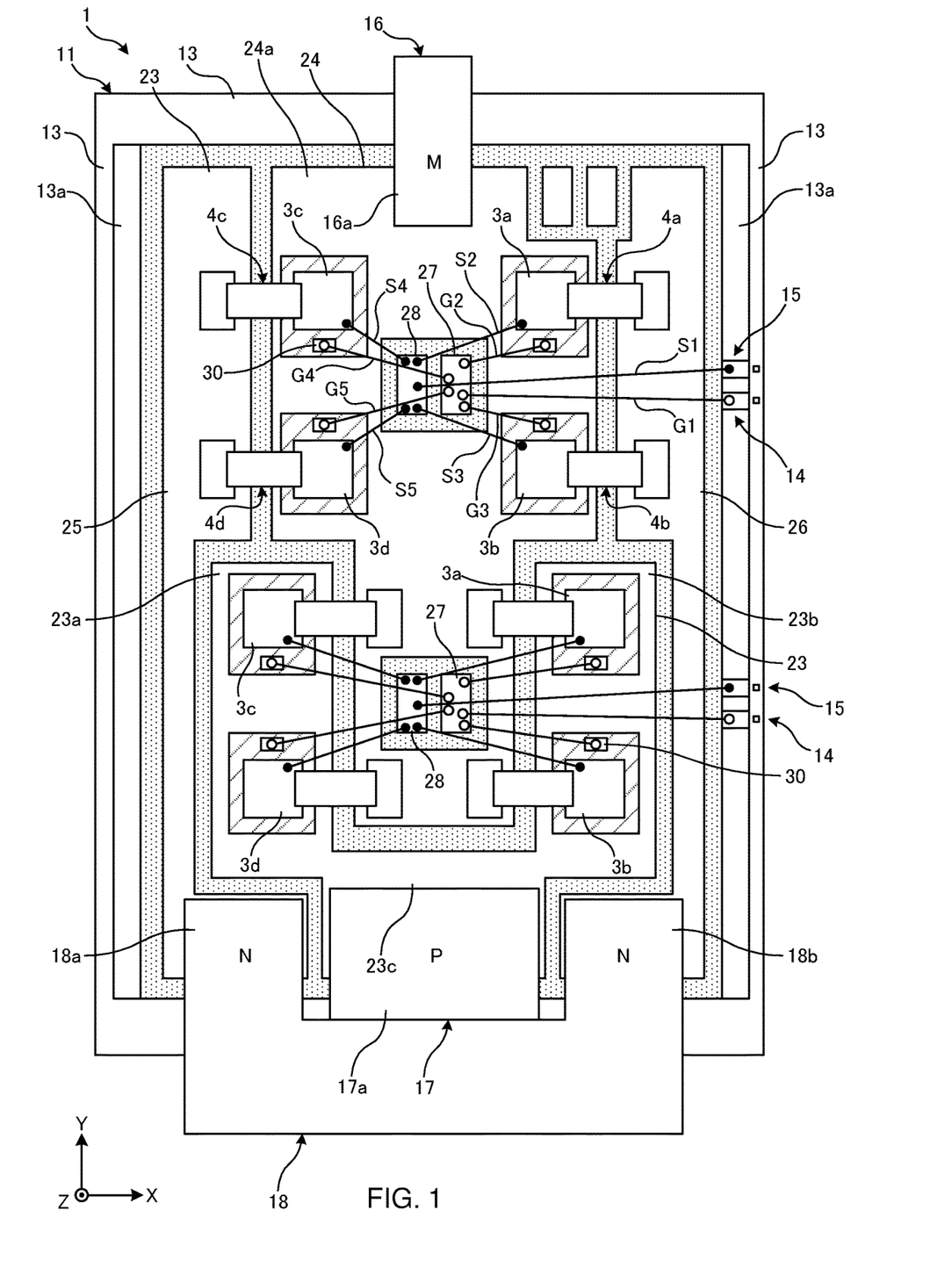
FIG. 1 is a plan view of a semiconductor device according to an embodiment.
Figure 2:
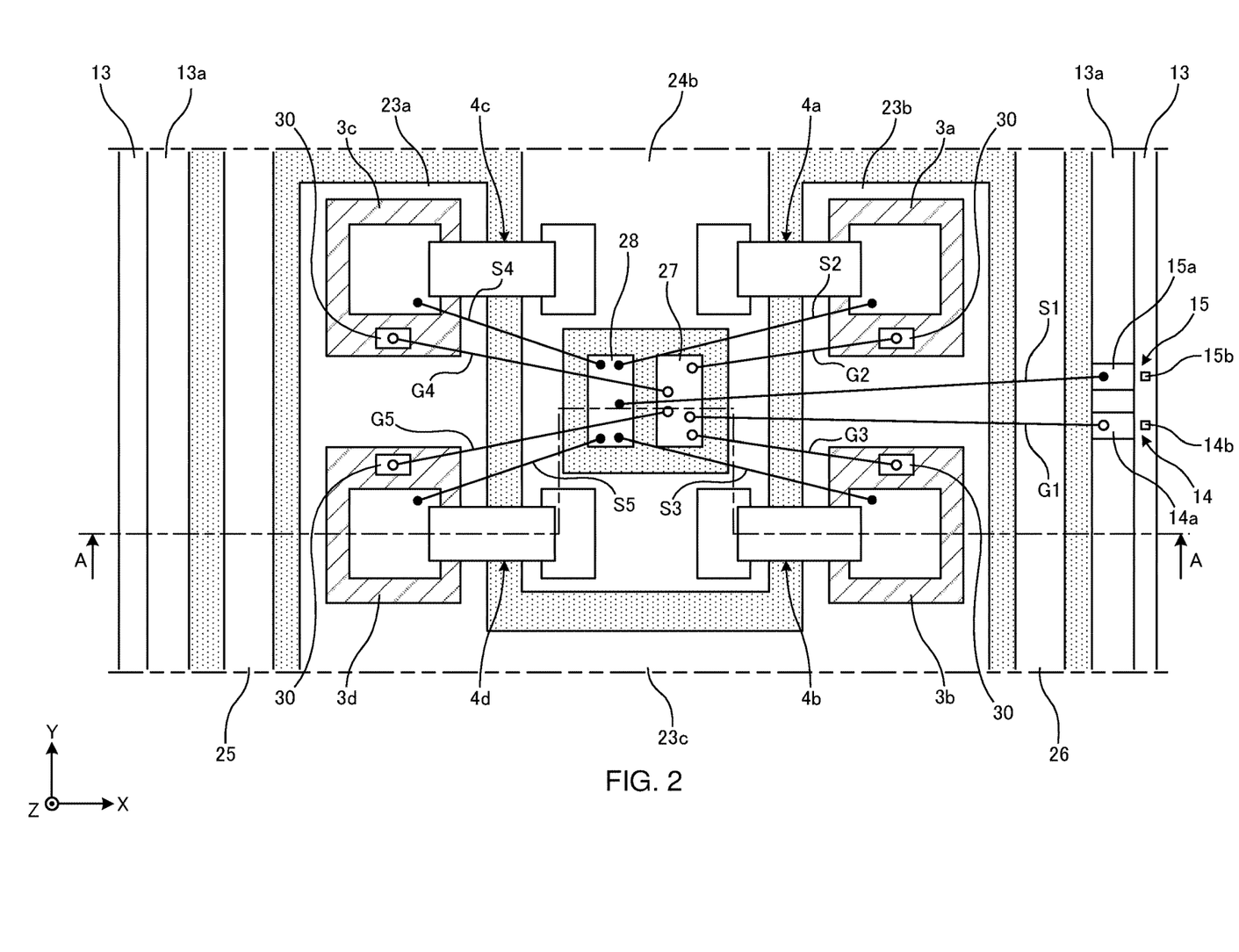
FIG. 2 is a partially enlarged view of an upper arm of the semiconductor device shown in FIG. 1.
Figure 3:
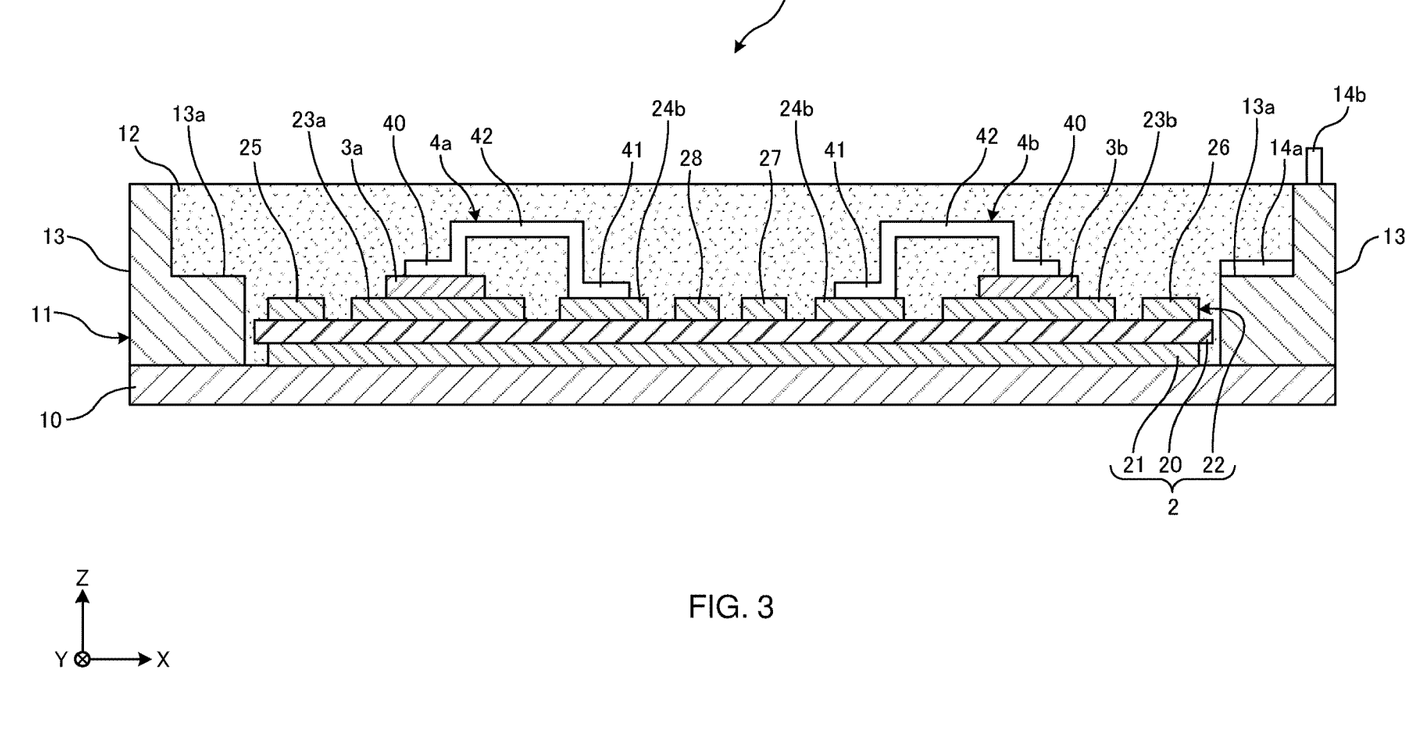
FIG. 3 is a cross-sectional view taken along Line A-A of the semiconductor device shown in FIG. 2.
Figure 4:
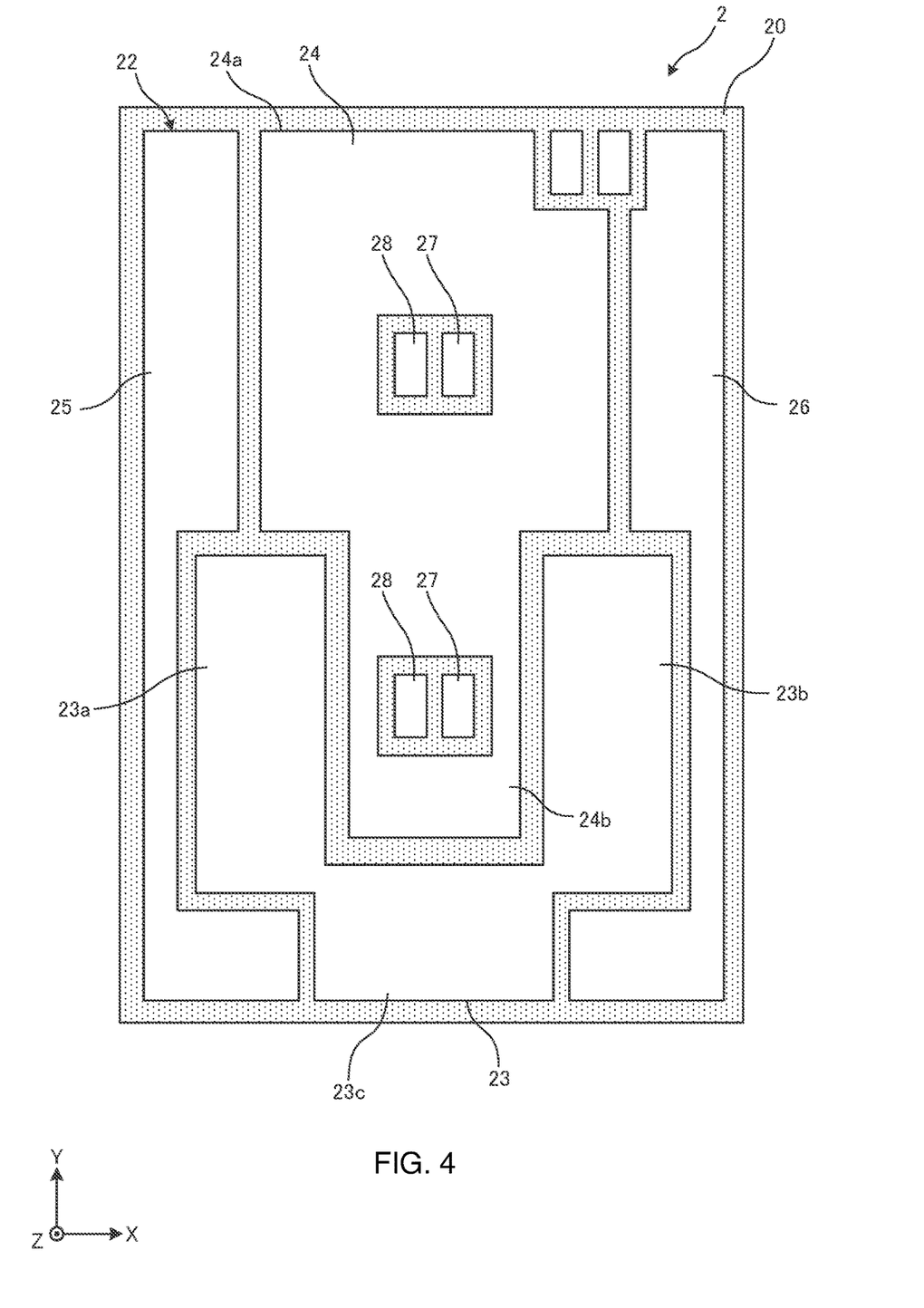
FIG. 4 is a plan view showing a layout of a circuit board according to the embodiment.
Figure 5:
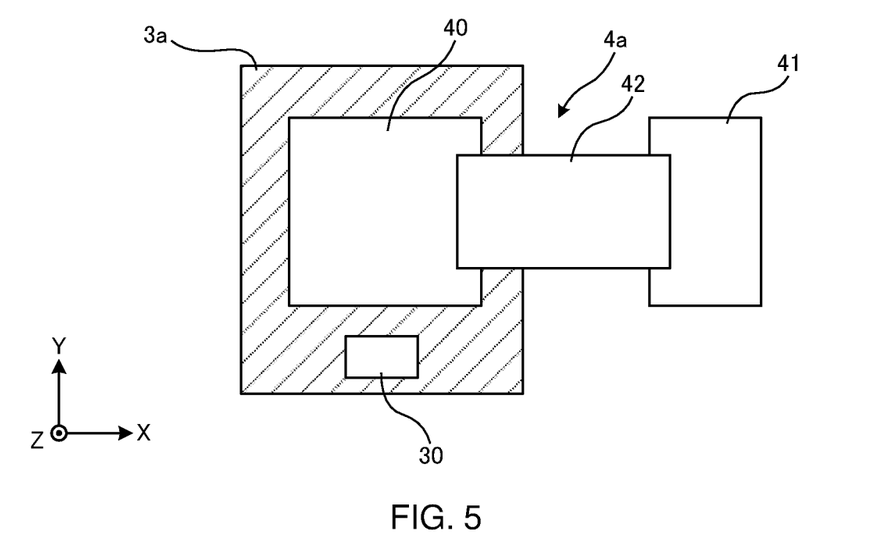
FIG. 5 is a plan view of a semiconductor element according to the embodiment.
Figure 6:
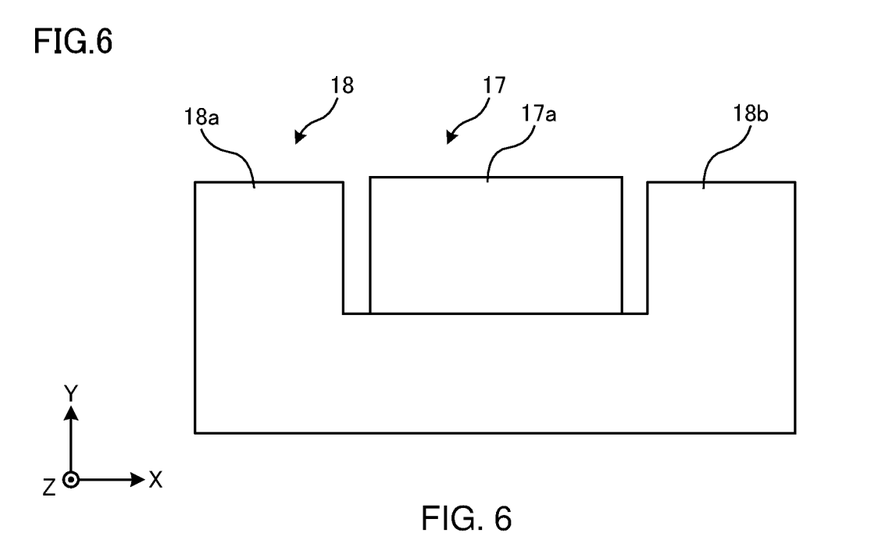
FIG. 6 is a plan view of a P terminal and an N terminal according to the embodiment.

A semiconductor module to which the present invention is applicable is described below. FIG. 1 is a plan view of a semiconductor device according to an embodiment. FIG. 2 is a partially enlarged view of an upper arm of the semiconductor device shown in FIG. 1. FIG. 3 is a cross-sectional view taken along Line A-A of the semiconductor device shown in FIG. 2. FIG. 4 is a plan view showing a layout of a circuit board according to the embodiment. FIG. 5 is a plan view of a semiconductor element according to the embodiment. FIG. 6 is a plan view of a P terminal and an N terminal according to the embodiment. Note that the semiconductor module described below is merely an example and, without limiting thereto, can be changed as required. In the following drawings, for convenience of illustration, an end of a gate wire is indicated by an open circle (○), and an end of a source wire is indicated by a solid circle (●).

In the following drawings, the direction in which a plurality of semiconductor modules are arranged, the direction in which an upper arm and a lower arm, which are connected in series, are arranged, and the direction of height are defined as an X-direction, a Y-direction, and a Z-direction, respectively. The shown X, Y, and Z axes are orthogonal to each other and forms a right-handed system. In some cases, the X, Y and Z-directions may be referred to as a right-left direction, a front-back direction, and a top-bottom direction, respectively. These directions (right-left, front-back and top-bottom directions) are words used for convenience of description, and, depending on the orientation of the attachment of the semiconductor device, the correspondence relationships with the XYZ directions may be changed. For example, the heat radiating surface side (cooler side) of the semiconductor device is referred to as a "lower surface side", and the opposite side is referred to as an "upper surface side". Planar view herein means that the upper surface of the semiconductor device is viewed from the Z-direction positive side.

The semiconductor device according to this embodiment is applied to a power conversion device in a power module, for example, and is a power module included in an inverter circuit. The semiconductor device includes a semiconductor module 1. With reference to FIG. 1, a single semiconductor module 1 is described. For example, in a case where the semiconductor device is included in a three-phase inverter circuit, three semiconductor modules in FIG. 1 are disposed side by side in order of a U phase, a V phase and a W phase.

As shown in FIGS. 1 to 4, the semiconductor module 1 includes a base plate 10, a laminate substrate 2 disposed on the base plate 10, a plurality of semiconductor elements disposed on the laminate substrate 2, a case member 11 that accommodates the laminate substrate 2 and the semiconductor elements, and a sealing resin 12 filled within the case member 11.

The base plate 10 is an oblong plate having an upper surface and a lower surface. The base plate 10 functions as a heatsink. The base plate 10 has a rectangular shape in planar view elongated in the X-direction. The base plate 10 is a metallic plate of, for example, copper, aluminum or an alloy thereof and the surface may be subjected to plating treatment.

The case member 11 that is rectangular in planar view and has a frame shape is disposed on the upper surface of the base plate 10. The case member 11 is molded with, for example, a synthetic resin and is jointed to the upper surface of the base plate 10 through an adhesive (not shown). The case member 11 has a shape following an external shape of the base plate 10 and is formed to have a frame shape by connecting, at four corners, a pair of side wall parts 13 facing each other in the X-direction and a pair of side wall parts 13 facing each other in the Y-direction.

On an inner side of the upper surface of the pair of side wall parts 13 facing each other in the X-direction, a step part 13a that is lower than the side wall parts 13 is formed. The step part 13a has an upper surface at a position lower than the upper end surfaces of the side wall parts 13. A gate terminal 14 and a source terminal 15 are integrally embedded as control terminals for external connection in the side wall part 13 positioned on the X-direction positive side of the pair of side wall parts 13 facing each other in the X-direction. The gate terminal 14 and the source terminal 15 are disposed such that their ends are exposed on the upper surface of the step part 13a.

The gate terminal 14 and the source terminal 15 are provided correspondingly in each of an upper arm and a lower arm, details of which are described below. One gate terminal 14 and one source terminal 15 are provided on the upper arm side (Y-direction negative side), and one gate terminal 14 and one source terminal 15 are provided on the lower arm side (Y-direction positive side). The gate terminal 14 and the source terminal 15 in each arm are disposed adjacently side by side in the Y direction. The gate terminal 14 is positioned on the Y-direction negative side, and the source terminal 15 is positioned on the Y-direction positive side.

The gate terminal 14 and the source terminal 15 are formed by bending a plate-like body of a metallic material such as a copper material, a copper-alloy-based material, an aluminum-alloy-based material or an iron-alloy-based material. The gate terminal 14 has a flat part 14a exposed on the upper surface of the step part 13a and a vertical part 14b having a tip projecting from the upper end surface of the side wall part 13. Similarly, the source terminal 15 has a flat part 15a exposed on the upper surface of the step part 13a and a vertical part 15b having a tip projecting from the upper end surface of the side wall part 13. A wiring member for control is connected to the flat parts 14a and 15a, the details of which are described below.

In the pair of side wall parts 13 facing each other in the Y-direction of the case member 11, an output terminal 16 (M terminal) as a case terminal is provided on the Y-direction positive side, and a positive electrode terminal 17 (P terminal) and a negative electrode terminal 18 (N terminal) as case terminals are provided on the Y-direction negative side, the details of which are described below.

Inside of the case member 11, the laminate substrate 2 is disposed on the upper surface of the base plate 10. The laminate substrate 2 is formed by stacking a metallic layer and an insulating layer and is configured by, for example, a direct copper bonding (DCB) substrate, an active metal brazing (AMB) substrate or a metallic base substrate. More specifically, the laminate substrate 2 has an insulating plate 20, a heatsink 21 disposed on a lower surface of the insulating plate 20, and a plurality of circuit boards 22 disposed on an upper surface of the insulating plate 20. The laminate substrate 2 is formed to be, for example, a rectangular shape in planar view.

The insulating plate 20 is formed to have a predetermined thickness in the Z-direction and to be a flat-shaped plate having an upper surface and a lower surface. The insulating plate 20 is formed from an insulating material such as a ceramics material such as alumina ($Al_2O_3$), aluminum nitride (AlN), or silicon nitride ($Si_3N_4$), a resin material such as epoxy, or an epoxy resin material using a ceramics material as a filler. The insulating plate 20 may also be referred to as an insulating layer or an insulating film.

The heatsink 21 is formed to have a predetermined thickness in the Z-direction and to cover the entire lower surface of the insulating plate 20. The heatsink 21 is formed by a metallic plate having a good thermal conductivity of, for example, copper or aluminum.

On the upper surface (main surface) of the insulating plate 20, the plurality of circuit boards 22 are formed to have independent island shapes where the circuit boards 22 are electrically insulated from each other. Each of the plurality of circuit boards 22 is configured by a metallic layer formed of, for example, copper foil and having a predetermined thickness. More specifically, the plurality of circuit boards 22 include first to fourth conductive layers 23 to 26 each having a U-shape in planar view.

The first conductive layer 23 is disposed at a position deviated on the Y-direction negative side of the insulating plate 20 and has a U-shape in planar view that is open on the Y-direction positive side. The second conductive layer 24 is disposed on the Y-direction positive side of the insulating plate 20 more than the first conductive layer and is partially surrounded by the U-shaped first conductive layer 23. The third conductive layer 25 and the fourth conductive layer 26 have an elongated shape extending in the Y-direction and are disposed to partially surround the first conductive layer 23 and the second conductive layer 24. The third conductive layer 25 and the fourth conductive layer 26 are disposed to face each other in the X-direction. The third conductive layer 25 is positioned on the X-direction negative side, and the fourth conductive layer 26 is positioned on the X-direction positive side.

The first conductive layer 23 has a U-shape in planar view having an open end on the Y-direction positive side. More specifically, the first conductive layer 23 has a pair of first elongated parts 23a and 23b that extend in a predetermined direction (Y-direction) and face each other in the direction (X-direction) crossing the predetermined direction and a first connection part 23c that connects ends of the pair of first elongated parts 23a and 23b. The first connection part 23c connects ends on the Y-direction negative side of the pair of first elongated parts 23a and 23b. Four semiconductor elements (first to fourth semiconductor elements 3a to 3d) included in the upper arm (first arm) are disposed in a mirror image arrangement on the first conductive layer 23, the details of which are described below.

The second conductive layer 24 has a shape that connects two rectangular parts having different X-direction widths side by side in the Y-direction. More specifically, the second conductive layer 24 has a first rectangular part 24a positioned on the Y-direction positive side and a second rectangular part 24b positioned on the Y-direction negative side. The first rectangular part 24a has an X-direction width larger than the second rectangular part 24b. The second rectangular part 24b is provided between the pair of first elongated parts 23a and 23b. Four semiconductor elements (first to fourth semiconductor elements 3a to 3d) included in the lower arm (second arm) are disposed in a mirror image arrangement on the second conductive layer 24, the details of which are described below.

Central regions of the first rectangular part 24a and the second rectangular part 24b have rectangular openings, and a gate relay layer 27 and a source relay layer 28 are formed in the openings as independent island-shaped control circuit boards. Each gate relay layer 27 and source relay layer 28 has a rectangular shape extending in the Y-direction. In other words, the gate relay layer 27 and the source relay layer 28 extend in parallel with the side wall part 13 having the gate terminal 14 and the source terminal 15 provided thereon.

The gate relay layer 27 and the source relay layer 28 are disposed side by side in the X-direction. The gate relay layer 27 is positioned on the X-direction positive side, and the source relay layer 28 is positioned on the X-direction negative side. The gate relay layer 27 and the source relay layer 28 are disposed at a middle position between the first semiconductor element 3a and the second semiconductor element 3b, and at a middle position between the third semiconductor element 3c and the fourth semiconductor element 3d, respectively, the details of which are described below. In other words, the gate relay layer 27 and the source relay layer 28 are surrounded by the first to fourth semiconductor elements 3a to 3d, and are provided at substantially equal distances from the semiconductor elements. Wires for control are connected to the gate relay layer 27 and the source relay layer 28. The plurality of circuit boards 22 configured in this way are disposed in a mirror image arrangement with respect to the X-direction center of the laminate substrate 2.

The plurality of semiconductor elements 3 are disposed at predetermined positions on the upper surface of the circuit boards 22 through a jointing material (not shown) such as soldering. Each of the semiconductor elements is formed to have a square shape in planar view by a semiconductor substrate of, for example, silicon (Si), silicon carbide (SiC), or gallium nitride (GaN). According to this embodiment, each of the semiconductor elements is configured by a reverse conducting (RC)-IGBT element integrally having functions of an insulated gate bipolar transistor (IGBT) element and a freewheeling diode (FWD) element.

Without limiting thereto, each of the semiconductor elements may be configured by a combination of a switching element such as an IGBT, a power metal oxide semiconductor field effect transistor (MOSFET) or a bipolar junction transistor (BJT) and a diode such as a freewheeling diode (FWD). Alternatively, for example, a reverse blocking (RB)-IGBT having sufficient resistance to pressure against reverse bias may be used as the semiconductor elements. The shape, arranged number and arranged positions of the semiconductor elements may be changed as required.

According to this embodiment, eight semiconductor elements are disposed for one phase. More specifically, according to this embodiment, four semiconductor elements (first to fourth semiconductor elements 3a to 3d) included in the upper arm and other four semiconductor elements (first to fourth semiconductor elements 3a to 3d) included in the lower arm are provided. The upper arm is positioned on the Y-direction negative side, and the lower arm is positioned on the Y-direction positive side. In other words, the upper arm and the lower arm are disposed side by side in the direction of extension of the side wall part 13 having the gate terminals 14 and the source terminals 15 provided thereon.

Each of the semiconductor elements has an upper-surface electrode (which may be referred to as an emitter electrode or a source electrode) and a lower-surface electrode (which may be referred to as a collector electrode or a drain electrode). Each of the semiconductor elements further has a gate electrode 30 (see FIG. 5) disposed at a deviated position on the outer periphery side of the upper surface.

The four semiconductor elements forming the upper arm are disposed on the upper surface of the first conductive layer 23 and are electrically connected in parallel. More specifically, the first semiconductor element 3a and the second semiconductor element 3b are disposed on the upper surface of the first elongated part 23b, and the lower-surface electrodes thereof are conductively connected to the first elongated part 23b. The first semiconductor element 3a and the second semiconductor element 3b are aligned in the Y-direction and are disposed such that the gate electrodes 30 thereof face each other. The first semiconductor element 3a is positioned on the Y-direction positive side, and the second semiconductor element 3b is positioned on the Y-direction negative side. In other words, the first semiconductor element 3a and the second semiconductor element 3b are disposed on the X-direction positive side in parallel along the side wall part 13 extending in the Y-direction.

The third semiconductor element 3c and the fourth semiconductor element 3d are disposed at positions symmetric to the first semiconductor element 3a and the second semiconductor element 3b with respect to the gate relay layer 27 and the source relay layer 28. More specifically, the third semiconductor element 3c and the fourth semiconductor element 3d are disposed on the upper surface of the first elongated part 23a, and the lower-surface electrodes thereof are conductively connected to the first elongated part 23a. The third semiconductor element 3c and the fourth semiconductor element 3d are aligned in the Y-direction and disposed such that the gate electrodes 30 thereof face each other. The third semiconductor element 3c is positioned on the Y-direction positive side, and the fourth semiconductor element 3d is positioned on the Y-direction negative side. In other words, the third semiconductor element 3c and the fourth semiconductor element 3d are disposed in parallel on the X-direction negative side along the side wall part 13 extending in the Y-direction. In this way, the first semiconductor element 3a and the third semiconductor element 3c face each other in the X-direction, and the second semiconductor element 3b and the fourth semiconductor element 3d face each other in the X-direction.

In the same manner, the four semiconductor elements forming the lower arm are disposed on the upper surface of the second conductive layer 24 and are electrically connected in parallel. More specifically, the first semiconductor element 3a and the second semiconductor element 3b are disposed on the upper surface on the X-direction positive side of the first rectangular part 24a, and the lower-surface electrodes thereof are conductively connected to the first rectangular part 24a. The first semiconductor element 3a and the second semiconductor element 3b are aligned in the Y-direction and disposed such that the gate electrodes 30 thereof face each other. The first semiconductor element 3a is positioned on the Y-direction positive side, and the second semiconductor element 3b is positioned on the Y-direction negative side. In other words, the first semiconductor element 3a and the second semiconductor element 3b are disposed in parallel on the X-direction positive side along the side wall part 13 extending in the Y-direction.

The third semiconductor element 3c and the fourth semiconductor element 3d are disposed at positions symmetric to the first semiconductor element 3a and the second semiconductor element 3b with respect to the gate relay layer 27 and the source relay layer 28. More specifically, the third semiconductor element 3c and the fourth semiconductor element 3d are disposed on the upper surface on the X-direction negative side of the first rectangular part 24a, and the lower-surface electrodes thereof are conductively connected to the first rectangular part 24a. The third semiconductor element 3c and the fourth semiconductor element 3d are aligned in the Y-direction and disposed such that the gate electrodes 30 thereof face each other. The third semiconductor element 3c is positioned on the Y-direction positive side, and the fourth semiconductor element 3d is positioned on the Y-direction negative side. In other words, the third semiconductor element 3c and the fourth semiconductor element 3d are disposed in parallel on the X-direction negative side along the side wall part 13 extending in the Y-direction. In this way, the first semiconductor element 3a and the third semiconductor element 3c face each other in the X-direction, and the second semiconductor element 3b and the fourth semiconductor element 3d face each other in the X-direction.

The upper arm and lower arm described above are connected in series. As shown in FIG. 1, the lower arm is disposed at a position deviated to the output terminal 16, which is described below, and the upper arm is disposed at a position deviated to the positive electrode terminal 17 or the negative electrode terminal 18. The first semiconductor element 3a, the second semiconductor element 3b, the third semiconductor element 3c and the fourth semiconductor element 3d included in the upper arm are disposed away from the X-direction center of the laminate substrate 2, while the first semiconductor element 3a, the second semiconductor element 3b, the third semiconductor element 3c and the fourth semiconductor element 3d included in the lower arm are disposed closely to the X-direction center of the laminate substrate 2.

The upper-surface electrodes of the semiconductor elements and the predetermined circuit boards 22 are electrically connected via metallic wiring boards (first to fourth wires 4a to 4d) as a main current wiring member. The first wire 4a connects the upper-surface electrode of the first semiconductor element 3a and the second rectangular part 24b or the fourth conductive layer 26. The second wire 4b connects the upper-surface electrode of the second semiconductor element 3b and the second rectangular part 24b or the fourth conductive layer 26. The third wire 4c connects the upper-surface electrode of the third semiconductor element 3c and the second rectangular part 24b or the third conductive layer 25. The fourth wire 4d connects the upper-surface electrode of the fourth semiconductor element 3d and the second rectangular part 24b or the third conductive layer 25.

Each of the metallic wiring boards is formed by bending, through, for example, press processing, a metallic material such as a copper material, a copper-alloy-based material, an aluminum-alloy-based material or an iron-alloy-based material. Because all of the metallic wiring boards have the same configuration, a common reference is given for description. More specifically, as shown in FIG. 3 and FIG. 5, the metallic wiring board includes a first junction part 40 to be jointed with the upper-surface electrode of the predetermined semiconductor element, a second junction part 41 to be jointed with the predetermined circuit board 22, and a connection part 42 that connects the first junction part 40 and the second junction part 41. The shape of the metallic wiring board shown in FIG. 3 and FIG. 5 is merely an example and can be changed as required. Each of the metallic wiring boards may be referred to as a lead frame. The metallic wiring boards (first to fourth wires 4a to 4d) extend in the X-direction in the planar view shown in FIG. 1.

In the case member 11, the output terminal 16, the positive electrode terminal 17, and the negative electrode terminal 18 are provided as case terminals for external connection of the main current as described above. The output terminal 16 is disposed on the Y-direction positive side of the pair of side wall parts 13 facing each other in the Y-direction of the case member 11. The positive electrode terminal 17 and the negative electrode terminal 18 are disposed on the Y-direction negative side of the pair of side wall parts 13 facing each other in the Y-direction of the case member 11.

Each of those case terminals are formed by, for example, press processing on, for example, a metallic material such as a copper material, a copper-alloy-based material, an aluminum-alloy-based material or an iron-alloy-based material. The output terminal 16 has an output end 16a connected to the first rectangular part 24a.

As shown in FIG. 1 and FIG. 6, the positive electrode terminal 17 has a positive electrode end 17a connected to the first connection part 23c. The negative electrode terminal 18 has two negative electrode ends 18a and 18b that are branched from a body part of the negative electrode terminal 18. The negative electrode ends 18a and 18b are disposed side by side in the X-direction with a predetermined interval therebetween. The positive electrode terminal 17 (positive electrode end 17a) is provided between the negative electrode ends 18a and 18b. The negative electrode end 18a positioned on the X-direction negative side is connected to an end on the Y-direction negative side of the third conductive layer 25. The negative electrode end 18b positioned on the X-direction positive side is connected to an end on the Y-direction negative side of the fourth conductive layer 26.

The gate terminal 14 and the source terminal 15 and the semiconductor elements are electrically connected by predetermined wiring members. More specifically, the end (flat part 14a) of the gate terminal 14 and the gate relay layer 27 are connected by a first gate wire G1. The gate electrode 30 of the first semiconductor element 3a and the gate relay layer 27 are connected by a second gate wire G2. The gate electrode 30 of the second semiconductor element 3b and the gate relay layer 27 are connected by a third gate wire G3. The gate electrode 30 of the third semiconductor element 3c and the gate relay layer 27 are connected by a fourth gate wire G4. The gate electrode 30 of the fourth semiconductor element 3d and the gate relay layer 27 are connected by a fifth gate wire G5.

The end (flat part 15a) of the source terminal 15 and the source relay layer 28 are connected by a first source wire S1. The source electrode of the first semiconductor element 3a (first junction part 40 jointed with the upper-surface electrode) and the source relay layer 28 are connected by a second source wire S2. The source electrode of the second semiconductor element 3b (first junction part 40 jointed with the upper-surface electrode) and the source relay layer 28 are connected by a third source wire S3. The source electrode of the third semiconductor element 3c (first junction part 40 jointed with the upper-surface electrode) and the source relay layer 28 are connected by a fourth source wire S4. The source electrode of the fourth semiconductor element 3d (first junction part 40 jointed with the upper-surface electrode) and the source relay layer 28 are connected by a fifth source wire S5.

The first gate wire G1 and the first source wire S1 are wired to extend between the first semiconductor element 3a and the second semiconductor element 3b, the details of which are described below. The first source wire S1 is adjacent to the first gate wire G1, the second source wire S2 is adjacent to the second gate wire G2, the third source wire S3 is adjacent to the third gate wire G3, the fourth source wire S4 is adjacent to the fourth gate wire G4, and the fifth source wire S5 is adjacent to the fifth gate wire G5.

As these wiring members, a conductor wire (bonding wire) is used. The conductor wire can be made of one or a combination of gold, copper, aluminum, a gold alloy, a copper alloy and an aluminum alloy. A member other than the conductor wire can be used as the wiring members. For example, a ribbon can be used as the wiring members.

Since the inductance between PN terminals affects a switching loss in a semiconductor module, reduction of the inductance has been demanded. With the recent innovation of technologies, when a next-generation device (which may also be referred to as a wideband gap semiconductor) of SiC, GaN, or the like is adopted, further reduction of the inductance is demanded. Not only fluctuations of the inductance between the PN terminals but also fluctuations of the gate-source inductance are required to be suppressed as much as possible.

Accordingly, the present inventors have focused on the layout of the circuit boards, semiconductor elements, case terminals and control terminals on an insulating substrate and have reached the present invention. More specifically, according to this embodiment, the gate relay layer 27 and the source relay layer 28 as control circuit boards are disposed at the center of the plurality of semiconductor elements forming one arm, as shown in FIG. 1. Correspondingly to these control circuit boards, the gate terminal 14 and the source terminal 15 are disposed side by side on the side wall part 13 on one side in the X-direction.

Between the side wall part 13 positioned on the X-direction positive side and a column having the first semiconductor element 3a and the second semiconductor element 3b, the fourth conductive layer 26 as a main wiring layer is disposed in parallel with the side wall part 13. The first gate wire G1 and the first source wire S1 are disposed in the vicinity along the first wire 4a and the second wire 4b connected to the fourth conductive layer 26.

Between the side wall part 13 (facing side wall part) on the X-direction negative side facing the side wall part 13 on the X-direction positive side across the gate relay layer 27 and the source relay layer 28, and a column having the third semiconductor element 3c and the fourth semiconductor element 3d, the third conductive layer 25 as another main wiring layer is disposed in parallel with the facing side wall part. The above-described third wire 4c is connected from the source electrode of the third semiconductor element 3c to the third conductive layer 25, and the fourth wire 4d is connected from the source electrode of the fourth semiconductor element 3d to the third conductive layer 25.

Because of this configuration, the first gate wire G1 and the first source wire S1 extend between the first semiconductor element 3a and the second semiconductor element 3b and are disposed adjacently to each other. The other gate wires and the corresponding source wires are wired adjacently to each other so as to have an equal length. As a result, fluctuations of the gate-source inductance can be suppressed.

According to this embodiment, in order to reduce the PN inductance, (1) the number of parallel columns through which the main current flows is increased from conventional one to two; and (2) a wiring pattern (circuit board layout) is adopted in which the current paths between the P terminal and the N terminal are parallel with each other such that the length of the current paths can be reduced as much as possible.

More specifically, the first to fourth semiconductor elements 3a to 3d on one side form the upper arm (first arm), and the first to fourth semiconductor elements 3a to 3d on the other side form the lower arm (second arm). The upper arm and the lower arm are disposed side by side in the direction (Y-direction) of extension of the side wall part 13 having the gate terminals 14 and the source terminals 15 provided thereon. On the upper arm side, the positive electrode terminal 17 (first external terminal) and the negative electrode terminal 18 (second external terminal) are adjacently arranged in a line. The positive electrode terminal 17 has the positive electrode end 17a (first end) to be electrically connected to the upper arm. The negative electrode terminal 18 has at least two branching negative electrode ends 18a and 18b (second ends) electrically connected to the lower arm. The positive electrode end 17a is disposed between the two negative electrode ends 18a and 18b.

Figure 7:
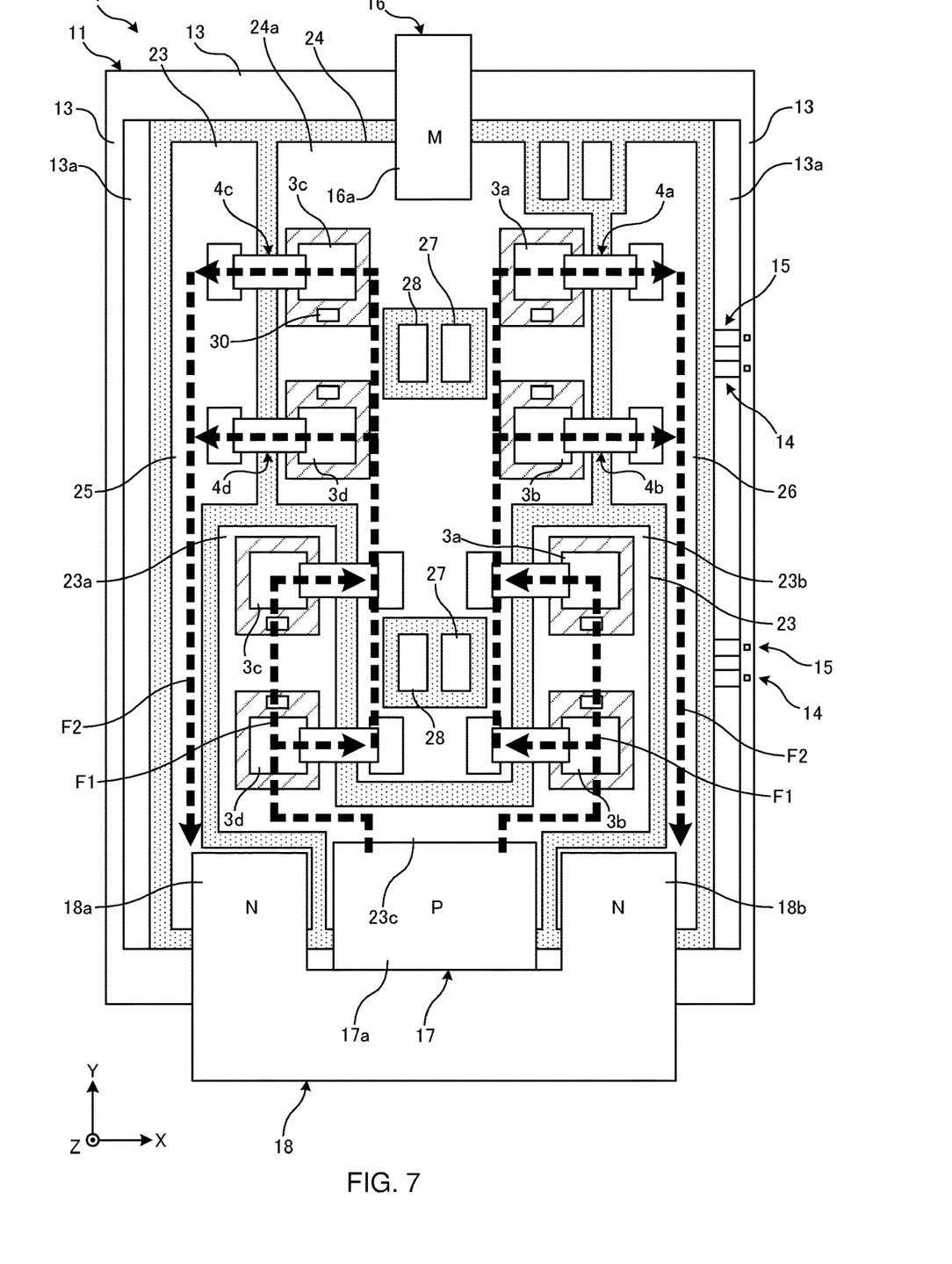
FIG. 7 is a schematic view showing flows of current in a semiconductor module according to the embodiment.

With reference to FIG. 7, flows of the main current are now described. FIG. 7 is a schematic diagram showing flows of current in the semiconductor module according to this embodiment. As shown in FIG. 7, in the semiconductor module 1, the main current flowing from the positive electrode terminal 17 is divided into two by the first elongated parts 23a and 23b on both outer sides. The main current flows from the first conductive layer 23 (the pair of first elongated parts 23a and 23b) through the first to fourth semiconductor elements 3a to 3d in the upper arm in the second conductive layer 24 (second rectangular part 24b). The main current further flows from the third conductive layer 25 and the fourth conductive layer 26 to the negative electrode ends 18a and 18b through the first to fourth semiconductor elements 3a to 3d in the lower arm.

Insulating paper, not shown, is sandwiched between parts where the positive electrode terminal 17 and the negative electrode terminal 18 are stacked. Since the positive electrode terminal 17 and the negative electrode terminal 18 are disposed adjacently to each other, the inductance of the terminals can be reduced.

In this way, according to this embodiment, as shown in FIG. 7, the current path F1 in the upper arm and the current path F2 in the lower arm are parallel and adjacent to each other, and the main currents flow in the opposite directions to each other. Therefore, because of the effect of the mutual inductance, reduction of the inductance can be realized, and the switching loss is reduced. Since a configuration is adopted in which each of the case terminals has a plurality of branching ends, the degree of adhesion between the other members can be improved when sealed with a resin, and the members cannot be easily peeled off. The entire layout is disposed in a mirror image arrangement as described above. Therefore, even though the current path is divided into two, deviation of the currents does not easily occur, and local heating can be suppressed.

According to this embodiment, as described above, not only the inductance between the PN terminals can be reduced, but also fluctuations of the gate-source inductances can be suppressed.

In the embodiment above, the number and arranged positions of the semiconductor elements are not limited to the configuration above but can be changed as required.

In the embodiment above, the number and layout of the circuit boards are not limited to the configuration above but can be changed as required.

Although the laminate substrate 2 and the semiconductor elements are formed to be in a rectangular shape or square shape in planar view according to the embodiment above, the present invention is not limited to the configuration. The laminate substrate 2 and the semiconductor elements may be formed to have a polygonal shape other than those described above.

Having described that, according to the embodiment above, the upper arm is positioned on the Y-direction negative side and the lower arm is positioned on the Y-direction positive side, the present invention is not limited to the configuration. The positional relationship between the upper and lower arms may be reversed from the one described above.

Although the positive electrode end 17a is provided between the two negative electrode ends 18a and 18b in the above-described embodiment, the present invention is not limited to the configuration. The positional relationship between the positive electrode terminal 17 and the negative electrode terminal 18 may be reversed from the one described above.

Although, according to the above-described embodiment, a configuration is adopted in which one end of the source wire is connected to the source electrode (upper-surface electrode of the semiconductor element) through the metallic wiring board (first junction part 40), the present invention is not limited to the configuration. The one end of the source wire may be directly connected to the source electrode.

Having described the embodiment and the variation examples, the embodiment and the variation examples may be wholly or partially combined as another embodiment. The embodiments are not limited to the above-described embodiment and variation examples, and various changes, replacements and modifications may be made thereto without departing from the spirit and scope of the technical idea. If the technical idea can be implemented in another manner based on a technological advancement or another technology derived therefrom, the technical idea may be carried out by such method. Therefore, the claims cover all embodiments that can be included within the scope of the technical idea.

Feature points of the above-described embodiment are organized below.

A semiconductor module according to the above-described embodiment includes a gate terminal and a source terminal each having a flat part exposed on a side wall part of a case member having a rectangular frame shape in planar view, a first semiconductor element and a second semiconductor element each disposed in parallel with the side wall part of the case member, each having a gate electrode and a source electrode on an upper surface of the semiconductor element, and being electrically connected in parallel, a gate relay layer and a source relay layer each being installed at a middle position between the first semiconductor element and the second semiconductor element and extending in parallel with the side wall part of the case member, a first gate wire extending between the first semiconductor element and the second semiconductor element and being connected from the flat part of the gate terminal to the gate relay layer, a first source wire extending between the first semiconductor element and the second semiconductor element and being connected from the flat part of the source terminal to the source relay layer, a second gate wire being connected from the gate electrode of the first semiconductor element to the gate relay layer, a second source wire being connected from the source electrode of the first semiconductor element to the source relay layer, a third gate wire being connected from the gate electrode of the second semiconductor element to the gate relay layer, and a third source wire being connected from the source electrode of the second semiconductor element to the source relay layer. The first source wire is adjacent to the first gate wire, the second source wire is adjacent to the second gate wire, and the third source wire is adjacent to the third gate wire.

The above-described semiconductor module further includes a main wiring layer disposed in parallel with the side wall part of the case member between the side wall part of the case member and a column having the first semiconductor element and the second semiconductor element, a first wire being connected from the source electrode of the first semiconductor element to the main wiring layer, and a second wire being connected from the source electrode of the second semiconductor element to the main wiring layer. The first gate wire is disposed in the vicinity along the first wire or the second wire.

The above-described semiconductor module further includes a third semiconductor element and a fourth semiconductor element disposed at positions symmetric to the first semiconductor element and the second semiconductor element, respectively, with respect to the gate relay layer and the source relay layer, each having a gate electrode and a source electrode on an upper surface of the semiconductor element, and being electrically connected in parallel with each other, a fourth gate wire being connected from the gate electrode of the third semiconductor element to the gate relay layer, a fourth source wire being connected from the source electrode of the third semiconductor element to the source relay layer, a fifth gate wire being connected from the gate electrode of the fourth semiconductor element to the gate relay layer, and a fifth source wire being connected from the source electrode of the fourth semiconductor element to the source relay layer. The fourth source wire is adjacent to the fourth gate wire, and the fifth source wire is adjacent to the fifth gate wire.

The above-described semiconductor module further includes another main wiring layer disposed, between a facing side wall part facing the side wall part of the case member across the gate relay layer and the source relay layer and a column having the third semiconductor element and the fourth semiconductor element, in parallel with the facing side wall part of the case member, a third wire being connected from the source electrode of the third semiconductor element to the other main wiring layer, and a fourth wire being connected from the source electrode of the fourth semiconductor element to the other main wiring layer.

In the above-described semiconductor module, a first arm is formed by a set of the first to fourth semiconductor elements, a second arm is formed by another set of the first to fourth semiconductor elements, and the first arm and the second arm are disposed side by side in a direction of extension of the side wall part of the case member. The semiconductor module further includes a first external terminal and a second external terminal adjacently arranged in a line on a side having the first arm. The first external terminal has a first end electrically connected to the first arm, the second external terminal has at least two branching second ends electrically connected to the second arm, and the first end is disposed between one and the other of the second ends.

INDUSTRIAL APPLICABILITY

As described above, the present invention has an effect that fluctuations of the gate-source inductance can be reduced and is particularly advantageous in a semiconductor module.

REFERENCE SIGNS LIST

1: semiconductor module
2: laminate substrate
3: semiconductor element
3a: first semiconductor element
3b: second semiconductor element
3c: third semiconductor element
3d: fourth semiconductor element
4a: first wire
4b: second wire
4c: third wire
4d: fourth wire
10: base plate
11: case member
12: sealing resin
13: side wall part
13a: step part
14: gate terminal
14a: flat part
14b: vertical part
15: source terminal
15a: flat part
15b: vertical part
16: output terminal
16a: output end
17: positive electrode terminal
17a: positive electrode end
18: negative electrode terminal
18a: negative electrode end
18b: negative electrode end
20: insulating plate
21: heatsink
22: circuit board
23: first conductive layer
23a: first elongated part
23b: first elongated part
23c: first connection part
24: second conductive layer
24a: first rectangular part
24b: second rectangular part
25: third conductive layer
26: fourth conductive layer
27: gate relay layer
28: source relay layer
30: gate electrode
40: first junction part
41: second junction part
42: connection part
F1: current path
F2: current path
G1: first gate wire
G2: second gate wire
G3: third gate wire
G4: fourth gate wire
G5: fifth gate wire
S1: first source wire
S2: second source wire
S3: third source wire
S4: fourth source wire
S5: fifth source wire

What is claimed is:
1. A semiconductor module, comprising:
a case member having a rectangular shape in a plan view of the semiconductor module, the case member having first and second side walls extending in a first direction, respectively disposed at opposite sides thereof;
a gate terminal and a source terminal each embodied in the first side wall, and each having a flat part that is exposed from a surface of the first side wall;

a first semiconductor element and a second semiconductor element aligned in the first direction and being electrically connected in parallel to each other, each of the first and second semiconductor elements having a gate electrode and a source electrode on an upper surface thereof;

a gate relay layer and a source relay layer each installed between the second side wall of the case member and the first and second semiconductor elements, the gate and source relay layers being aligned in a second direction orthogonal to the first direction, positioned at a center between the first and second semiconductor elements in the first direction, and each extending in the first direction;

a plurality of gate wires, including a first gate wire, a second gate wire and a third gate wire, wherein
the first gate wire connects the flat part of the gate terminal to the gate relay layer by passing between the first and second semiconductor elements,
the second gate wire connects the gate electrode of the first semiconductor element to the gate relay layer, and
the third gate wire connects the gate electrode of the second semiconductor element to the gate relay layer;

a plurality of source wires, including a first source wire, a second source wire and a third source wires, wherein
the first source wire connects the flat part of the source terminal to the source relay layer by passing between the first and second semiconductor elements;
the second source wire connects the source electrode of the first semiconductor element to the source relay layer; and
the third source wire connects the source electrode of the second semiconductor element to the source relay layer, wherein
the first source wire is located closer to the first gate wire than is any other of the plurality of gate wires, the second source wire is located closer to the second gate wire than is any other of the plurality of gate wires and the third source wire is closer to the third gate wire than is any other of the plurality of gate wires.

2. The semiconductor module according to claim 1, further comprising:
a main wiring layer, through which a main current flows the first direction, and being disposed in an area between, in the second direction, the first side wall and the first and second semiconductor elements;
a first connecting wire connecting the source electrode of the first semiconductor element to the main wiring layer; and
a second connecting wire connecting the source electrode of the second semiconductor element to the main wiring layer,
wherein the first gate wire extends along the one of the first connecting wire or the second connecting wire.

3. The semiconductor module according to claim 1, further comprising:
a third semiconductor element and a fourth semiconductor element disposed at positions symmetric to positions of the first semiconductor element and the second semiconductor element, respectively, with respect to the gate relay layer and the source relay layer, each of the third and fourth semiconductor elements being electrically connected in parallel to each other, and having a gate electrode and a source electrode on an upper surface thereof, wherein
the plurality of gate wires further includes
a fourth gate wire connecting the gate electrode of the third semiconductor element to the gate relay layer, and
a fifth gate wire connecting the gate electrode of the fourth semiconductor element to the gate relay layer;
the plurality of the source wires further includes a fourth source wire connecting the source electrode of the third semiconductor element to the source relay layer, and
a fifth source wire connecting the source electrode of the fourth semiconductor element to the source relay layer, wherein
the fourth source wire is located closer to the fourth gate wire than is any other of the plurality of gate wires, and the fifth source wire is located closer to the fifth gate wire than is any other of the plurality of gate wires.

4. The semiconductor module according to claim 3, further comprising:
an other main wiring layer through which the main current also flows in the first direction, and being disposed between, in the second direction, the second side wall and the third and fourth semiconductor elements;
a third connecting wire connecting the source electrode of the third semiconductor element to the other main wiring layer; and
a fourth connecting wire connecting the source electrode of the fourth semiconductor element to the other main wiring layer.

5. The semiconductor module according to claim 4, further comprising:
a first external terminal and a second external terminal adjacently aligned in the second direction, wherein
the first to fourth semiconductor elements are a first set of semiconductor elements and form a first arm,
an other set of first to fourth semiconductor elements forming a second arm, the first and second arms being aligned in the first direction, the first and second external terminals being disposed closer to the first arm than is the second arm,
the first external terminal has an end electrically connected to the first arm, and
the second external terminal has a body part and at least one and an other end that are branched from the body part and each are electrically connected to the second arm, the end of the first external terminal being disposed between the one and the other end of the second external terminal.

6. The semiconductor module according to claim 1, wherein the first source wire and the first gate wire have substantially the same length, the second source wire and the second gate wire have substantially the same length, and the third source wire and the third gate wire have substantially the same length.

* * * * *